United States Patent [19]

Long et al.

[11] Patent Number: 4,864,225
[45] Date of Patent: Sep. 5, 1989

[54] COAXIAL CABLE TRACER AND TESTER

[76] Inventors: Larry D. Long, 3967 La Crescenta Rd.; Noel Lucero, 500 La Palmo, both of El Sobrante, Calif. 94803

[21] Appl. No.: 193,080

[22] Filed: May 12, 1988

[51] Int. Cl.$^4$ .................................................. G01R 31/02
[52] U.S. Cl. .................................... 324/133; 324/506; 324/542; 324/543
[58] Field of Search ................ 324/133, 506, 542, 543

[56] References Cited

U.S. PATENT DOCUMENTS

| 3,873,915 | 3/1975 | Hayes | 324/506 |
| 4,066,953 | 1/1978 | Gold | 324/133 |
| 4,553,085 | 11/1985 | Canzano | 324/542 |
| 4,740,745 | 4/1988 | Sainz | 324/133 |

FOREIGN PATENT DOCUMENTS

| 7919462 | 7/1979 | Fed. Rep. of Germany | 324/133 |
| 587036 | 4/1947 | United Kingdom | 324/506 |

Primary Examiner—Reinhard J. Eisenzopf
Assistant Examiner—Jose M. Jolis
Attorney, Agent, or Firm—Harris Zimmerman; Howard Cohen

[57] ABSTRACT

A device for testing continuity of coaxial cables and tracing coaxial cables through junction boxes and the like includes a cylindrical housing formed in penlight fashion with an LED at the distal end and a battery disposed therein. The proximal end of the housing is provided with a female coaxial fitting having the conductor receiving portion connected in the LED-battery circuit. A cable terminator is provided, including a male coaxial fitting in which the conductor portion is shorted directly to the shield-engaging portion. The cable terminator is secured to a distant end of a coaxial cable, e.g., far removed from a cable junction box. The female coaxial fitting is secured to one of many near cable ends within or exiting from a junction box; if the coaxial circuit is completed and the LED is illuminated, it is determined that the distant and near cable ends are opposite ends of the same coaxial cable.

6 Claims, 1 Drawing Sheet

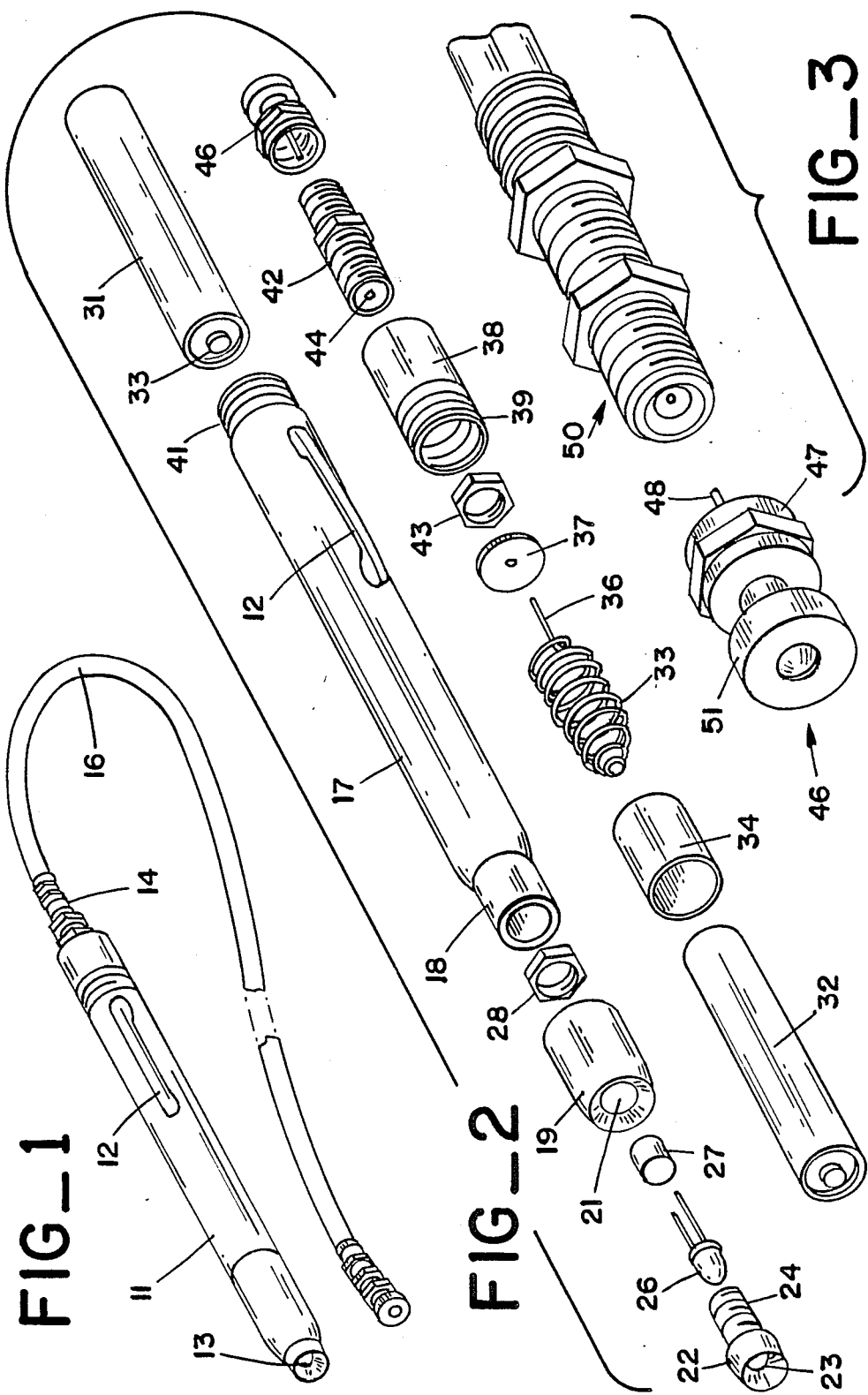

COAXIAL CABLE TRACER AND TESTER

BACKGROUND OF THE INVENTION

The explosive growth of cable television service (CATV) and other coaxial data transmission services has involved the installation and maintenance of large networks of coaxial cables. Although coaxial cables are generally easier to install than AC utility wiring, maintenance and revision of existing coaxial cable networks can be extremely tedious.

In most coaxial cable systems, a large number of cable runs extend to a central junction box for connection to a common source such as a main cable line or the like. Unlike telephone wiring, coaxial cable are generally not provided with color coding or any other form of identifying indicia. This factor makes difficult the removal, repair, or rerouting of coaxial cables in many installations. Generally speaking, when it is necessary to trace a coaxial cable from a junction box to a customer installation, a technician secures a short circuit cable terminator to the customer end of the cable, and then sorts through the maze of cables at the central junction box. A volt-ohm meter is connected to each of the ends of the cables in the junction box, and the technician reads the meter to determine which junction box cable end is connected to the particular customer end. A non-associated cable end will produce a resistance reading of substantially infinite resistance; the correct, associated cable end will produce a reading of approximately 75 ohms. This procedure, which invovles connecting and disconnecting the VOM to a large number of cable ends and making a visual meter reading for each one, is extremely tedious and time consuming.

SUMMARY OF THE PRESENT INVENTION

The present invention generally comprises a device for testing the continuity of coaxial cables in installations, and also for tracing coaxial cables from customer end terminations to junction boxes and the like. The invention includes a cylindrical housing formed in penlight fashion with an LED at the distal end and a battery disposed therein. The proximal end of the housing is provided with a female coaxial fitting having the conductor receiving portion connected in a circuit with the LED and battery. A cable terminator is provided, including a male coaxial fitting in which the conductor portion is shorted directly to the shield-engaging portion. The cable terminator is secured to a distant end of a coaxial cable, far removed from a cable junction box; e.g., the customer termination of the coaxial cable. The female coaxial fitting of the device is secured to one of many near cable ends within or existing from a junction box; if the coaxial circuit is completed and the LED is illuminated, it is determined that the distant and near cable ends are opposite ends of the same coaxial cable. The device can also be employed, in conjunction with two cable ends known to be associated with one cable section, to determine if the cable section is continuously conductive or if a short or open circuit exists in the cable section.

BRIEF DESCRIPTION OF THE DRAWING

FIG. 1 is a perspective view of the CATV cable tracer device of the present invention.

FIG. 2 is an exploded perspective view of the CATV cable tracer device of the present invention.

FIG. 3 is a magnified, exploded view of the cable terminator component of the present invention, shown proximate to a coaxial cable end with which it is used.

DESCRIPTION OF THE PREFERRED EMBODIMENT

The present invention generally comprises a device for testing the continuity of a coaxial cable, and for identifying coaxial cables entering and exiting a junction box or the like. With regard to FIG. 1, the device includes a housing 11 fashioned like a penlight flashlight, with a light source 13 disposed at the distal end thereof, and a pocket clip 12 secured to the peripheral surface of the proximal portion of the housing. The proximal end of the housing 11 is provided with a coaxial cable connector fitting 14 for releasably connecting a coaxial cable 16 to the device for testing and/or identifying purposes, as will be explained in the following description.

As shown in FIG. 2, the housing 11 incorporates a hollow, cylindrical conductive tube 17 provided with a reduced diameter cylindrical neck 18 extending from the distal end thereof. A distal end cap 19 is provided with a tapered cylindrical configuration and a diameter sufficient to be slidably received about the neck 18. The end cap includes a central aperture 21 in the distal end thereof. An LED holder 22 includes an interior space dimensioned to receive a twin lead LED 26 and the LED integral lens 23 in the distal end thereof, and a proximal threaded end 24. The twin leads of the LED extend through an insulator bushing 27, one of the leads contacting the conductive holder 22 and the other lead forming a central contact within the LED holder. The threaded end 24 extends through the aperture 21 and is secured therein by a nut 28. Thus the entire LED assembly is secured within the end cap 19, which is easily separable from the member 17, with the proximal end 24 and the central contact lead of the LED extending into the neck portion 18 of the tube 17.

The tube 17 is dimensioned to receive and retain a pair of electrical energy cells 31 and 32, such as AA size or the like, disposed in series with the distal cell 31 having a positive terminal 33 extending to the neck portion 18 of the tube 17 and contacting the central contact lead of the LED 26. A compression spring 33 is disposed proximally of the end of the cell 32, making contact with the negative terminal of the cell 32. An insulator cylinder 34 of paper, plastic, or the like extends concentrically about the spring 33 to prevent contact with the tube 17, and the proximal end 36 of the spring extends proximally and coaxially with respect to the tube 17. An insulator washer 37 is disposed proximally of the insulator 34 and the spring 33, with the end 36 extending through a central aperture in the washer 37.

The device further includes a proximal end cap 38, comprising a tubular conductive member having a threaded distal end 39 adapted to engage a like-threaded proximal end 41 of the tubular member 17. Secured to the proximal end of the end cap 38 is a standard female coaxial cable connector fitting 42, joined thereto by a nut 43. The fitting is dimensioned and disposed so that the end 36 of the spring 33 extends into the aperture 44 of the coaxial fitting 42 to serve as a contact probe, as will be explained below.

Another significant component of the present invention is a cable terminator 46 which is adapted to connect the central conductor of a coaxial cable to the shielding portion thereof. The terminator 46, as shown in FIG. 3, is generally well-known in the prior art, and includes a threaded nut portion 47 dimensioned to be secured to a standard coaxial female connector fitting 50, and a central conductor 48 extending therefrom and disposed to be received by the female connector fitting. The terminator includes a conductive end 51 that electrically connects the connector 48 to the nut portion 47 to create either a direct short circuit or a 75 ohm circuit between the shielding and the conductor of a coaxial cable.

After the cable terminator is secured to one end of a coaxial cable, the device 11 is employed by connecting a free cable end to the fitting 42, so that the central conductor of the cable is electrically connected to the contact probe 36 of the device. It may be appreciated that an electrical circuit is defined by the probe contact 36, the spring 33, the battery 32 and 33, the central contact of the LED 26, the LED itself, the outer housing members 19, 18, 17, and the end cap 38 connected to the cable shielding by the fitting 42. If the terminator 46 and the device 11 are connected to the opposed ends of the same continuous coaxial cable section, the LED will be illuminated and the technician will be apprised of the fact that both cable ends have been identified. Likewise, if it is known that both cable ends are associated with the same cable section, and the LED is not illuminated, it is demonstrated that the cable section is defective, and that a discontinuity exists in either the conductor or the shielding.

It may be appreciated that the device of the present invention is easily connected and disconnected from coaxial cable ends, and that the LED indicator provides a much more rapid and definitive indication of cable continuity and identity than a VOM meter reading, as is known in the prior art.

We claim:

1. An assembly for testing continuity of coaxial cables and tracing coaxial cables through junction boxes, including; a cylindrical housing assembly formed in penlight fashion, an LED secured at the distal end of said housing, a battery disposed in said housing, a quick-connect coaxial cable connector fitting secured at the proximal end of said housing and adapted to releasably receive one end of a coaxial cable inserted therein, said fitting including pair of contacts disposed to be connected to a coaxial cable end by insertion of the coaxial cable end therein, said pair of contacts including a central contact disposed to connect to the conductor of the coaxial cable secured to said connector and a peripheral contact portion disposed to connect to the shielding of the coaxial cable secured to said connector, electrical circuit means extending from said central contact to said battery, to said LED, through said cylindrical housing assembly to said peripheral contact portion of said coaxial cable connector, cable terminator means releasably securable to one end of a coaxial cable undergoing testing or tracing, including means for establishing a low resistance connection between the conductor and shielding of said one end of the coaxial cable, and a compression spring disposed in said housing between said battery and said proximal end of said housing, said central contact comprising the proximal end portion of said compression spring.

2. The device for testing and tracing coaxial cables of claim 1, wherein said cylindrical housing assembly includes a reduced diameter neck at said distal end of said housing, a distal end cap removably securable to said neck, and means for securing said LED to said distal end cap.

3. The device for testing and tracing coaxial cables of claim 2, further including a proximal end cap removably securable to said cylindrical housing assembly, and means for securing said coaxial cable connector fitting to said proximal end cap.

4. The device for testing and tracing coaxial cables of claim 3, further including a compression spring disposed between said battery and said proximal end cap, said central contact comprising the proximal end portion of said compression spring.

5. The device for testing and tracing coaxial cables of claim 4, further including an insulator sleeve secured about said compression spring to prevent electrical contact between said compression spring and said cylindrical housing assembly.

6. The device for testing and tracing coaxial cables of claim 5, further including a pocket clip secured to the outer peripheral surface of said cylindrical housing assembly.

* * * * *